(12) United States Patent
Moench et al.

(10) Patent No.: US 7,315,054 B1
(45) Date of Patent: Jan. 1, 2008

(54) DECOUPLING CAPACITOR DENSITY WHILE MAINTAINING CONTROL OVER ACLV REGIONS ON A SEMICONDUCTOR INTEGRATED CIRCUIT

(75) Inventors: Jerry D. Moench, Austin, TX (US); James C. Pattison, Round Rock, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 11/174,713

(22) Filed: Jul. 5, 2005

(51) Int. Cl.
  *H01L 27/108* (2006.01)
  *H01L 29/76* (2006.01)
  *H01L 29/94* (2006.01)
  *H01L 31/119* (2006.01)

(52) U.S. Cl. ............... 257/304; 257/71; 257/296; 257/53; 257/E27.016; 257/E29.346; 257/E27.092

(58) Field of Classification Search .......... 257/71, 257/296, 304, 53, E29.346, E27.016, E27.092
See application file for complete search history.

(56) References Cited

U.S. PATENT DOCUMENTS

| | | | |
|---|---|---|---|
| 5,010,447 A | * | 4/1991 | Wallace ............ 361/782 |
| 5,053,921 A | * | 10/1991 | Nelson et al. ............ 361/794 |
| 5,636,133 A | | 6/1997 | Chesebro |
| 5,923,563 A | | 7/1999 | Lavin |
| 6,323,113 B1 | | 11/2001 | Gabriel |
| 2004/0073881 A1 | * | 4/2004 | Nassif et al. ............ 716/10 |
| 2005/0057286 A1 | * | 3/2005 | Shepard et al. ............ 327/141 |
| 2005/0114820 A1 | * | 5/2005 | Restle ............ 716/13 |
| 2006/0124982 A1 | * | 6/2006 | Ho et al. ............ 257/304 |

OTHER PUBLICATIONS

Dreibelbis, et al, "The Hidden Benefits of IBM ASICs: Part 1", *IBM Microelectronics*, IBM, Third Quarter 2000, vol. 6, No. 3.

* cited by examiner

*Primary Examiner*—Michelle Estrada
*Assistant Examiner*—Jarrett J Stark
(74) *Attorney, Agent, or Firm*—Meyertons Hood Kivlin Kowert & Goetzel, P.C.; B. Noël Kivlin; Stephen J. Curran

(57) ABSTRACT

In one embodiment, a method of controlling the across-chip line-width variation (ACLV) on a semiconductor integrated circuit includes forming an ACLV controlled region including a plurality of semiconductor devices each having a gate structure and arranging the plurality of semiconductor devices to have a substantially uniform spacing between each gate structure. The method also includes forming a decoupling capacitor region adjacent to the ACLV controlled region. The decoupling capacitor region may include a plurality of capacitor structures each having a conductive structure, such as a polysilicon electrode, for example.

7 Claims, 6 Drawing Sheets

DECOUPLING CAPACITOR DENSITY WHILE MAINTAINING CONTROL OVER ACLV REGIONS ON A SEMICONDUCTOR INTEGRATED CIRCUIT

BACKGROUND OF THE INVENTION

1. Field of the Invention

This invention relates to integrated circuit design and, more particularly, to the layout of integrated circuits.

2. Description of the Related Art

Since the first semiconductor integrated circuit (IC) was built many years ago, semiconductor device geometries have been shrinking at a phenomenal rate. The reduction in device geometries may be driven by various factors. IC manufacturers may overcome their huge investment in the building and start-up of a fabrication facility (fab) using economies of scale. For example, the smaller a manufacturer can make an IC, the more ICs may be manufactured on a single semiconductor wafer. This concept translates to more dollars per wafer. Another factor that may be driving the reduction in device geometries is the demand for faster components. Generally speaking, as a device's critical dimensions such as the transistor physical gate width (which corresponds to the transistor's channel length) are reduced, the device becomes faster. Since there is an ever-increasing demand for faster microprocessors and related computer system components, the manufacturing process is driven to produce ever-smaller devices. Consistently controlling a transistor's channel length (and thus the physical gate width) is an important aspect for yielding high performance integrated circuits. However, as device geometries get smaller, it becomes more difficult to consistently control the transistor's channel length.

The manufacturing process involves many complex process steps. For example, one of the manufacturing process steps is photolithography. In the photolithography step, the IC devices and connections are patterned onto the wafer in various steps using light sources, optics, photoresist, and mask sets. Another manufacturing process step includes one or more etch steps. Etching includes removing or etching unwanted portions or layers of the IC or photoresist using various etching techniques. Due to limitations in various process steps such as the photolithography process and the etching process, for example, the ability to pattern and etch the devices uniformly becomes more difficult as the device geometries shrink. This may result in difficulty predicting the resulting critical dimensions of devices. This may be especially true when patterning and etching polycrystalline (poly) silicon.

Depending upon how densely the devices are packed together may determine how closely the patterned dimensions compare to the dimensions as specified and drawn. A given process may yield a given poly gate width for devices having one poly pitch. However, when the same process is used on a group of devices with a different poly pitch, that same process may yield a different gate width. This same phenomenon may be observed for other lines patterned onto the wafer. Stated differently, the finished line widths may vary depending on the line-to-line pitch. This variance is sometimes referred to as across chip line-width variation (ACLV).

To overcome this unpredictability, IC designers may group devices in a particular area (or an entire chip) such that the pitch between polysilicon gates is substantially the same for all the devices in that area (or chip). Designers may use some predetermined ACLV guidelines to control the line widths, etc. For example, by making the pitch substantially the same for the devices in the area, the line widths may be more closely predicted and controlled. Controlling the line widths may be of particularly interest for devices that have gates with critical dimensions. However, enforcing the ACLV guidelines may be challenging due to fringe effects that may be caused by any changes in the density of the polysilicon near the edges of the ACLV controlled areas.

SUMMARY

Various embodiments of a semiconductor integrated circuit including an improved decoupling capacitor density while maintaining control over across-chip line-width variation regions are disclosed. In one embodiment, a method of controlling the across-chip line-width variation (ACLV) on a semiconductor integrated circuit includes forming an ACLV controlled region including a plurality of semiconductor devices each having a gate structure and arranging the plurality of semiconductor devices to have a substantially uniform spacing between each gate structure. The method also includes forming a decoupling capacitor region adjacent to the ACLV controlled region. The decoupling capacitor region may include a plurality of capacitor structures each having a conductive structure, such as a polysilicon electrode, for example.

In one specific implementation, the method may also include forming the decoupling capacitor region such that a density of the material used to form the conductive structures is increased as the distance from the ACLV controlled region increases.

Figure 1:
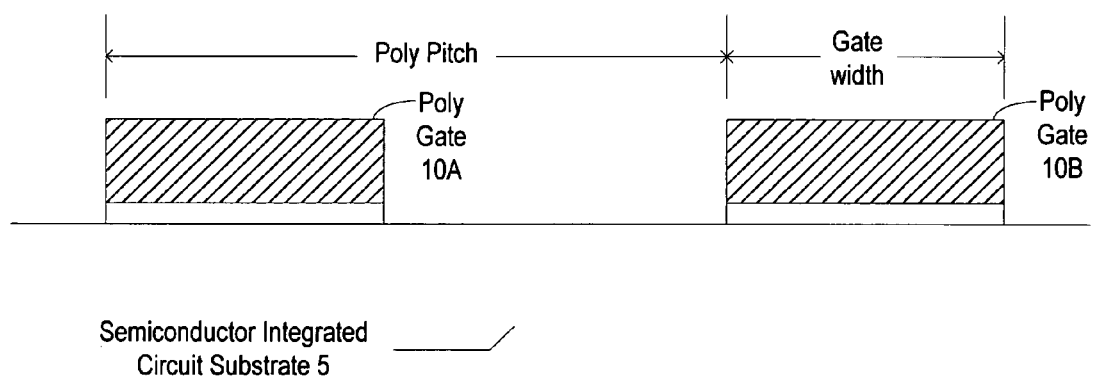
FIG. 1 is a cross-section of one embodiment of a semiconductor integrated circuit including a pair of polysilicon gates.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must). The term "include" and derivations thereof mean "including, but not limited to." The term "connected" means "directly or indirectly connected," and the term "coupled" means "directly or indirectly coupled."

DETAILED DESCRIPTION

Semiconductor integrated circuits may include devices that have polysilicon (poly) gates. Depending on the specific circuital configurations, these poly gates may be positioned such that the gates form parallel lines with some distance between the lines. FIG. 1 is a cross-sectional diagram of one embodiment of a pair of polysilicon gates formed on a semiconductor integrated circuit substrate 5. Poly gate 10A is on the left and poly gate 10B is on the right. The distance from a point on one gate to the same point on the next gate is referred to as the pitch or poly pitch when the material is poly. Typically the gate edge is used as a reference to define the pitch. In addition, the gate width is the width of the gate poly. It is noted that in FIG. 1, only the poly gates are described and shown and that other device features have been omitted for simplicity. It is further noted that the structures shown in FIG. 1 through FIG. 6 are not drawn to scale.

As described above, depending on the process, the finished gate width may be different than the gate width that is specified during the IC design and layout process. In addition, the finished gate width may vary across the IC dependent upon the density of the devices as determined, for example, by the poly pitch in a given area. Accordingly, to control and predict, to some degree, the variation in gate widths across a given area, a given poly pitch may be selected. The selected poly pitch may used throughout a given area to create an ACLV controlled region. However, as described further below, depending on the poly density in areas adjacent to the ACLV controlled region, a given ACLV controlled region may not appear to be uniform from a processing perspective.

Figure 2:
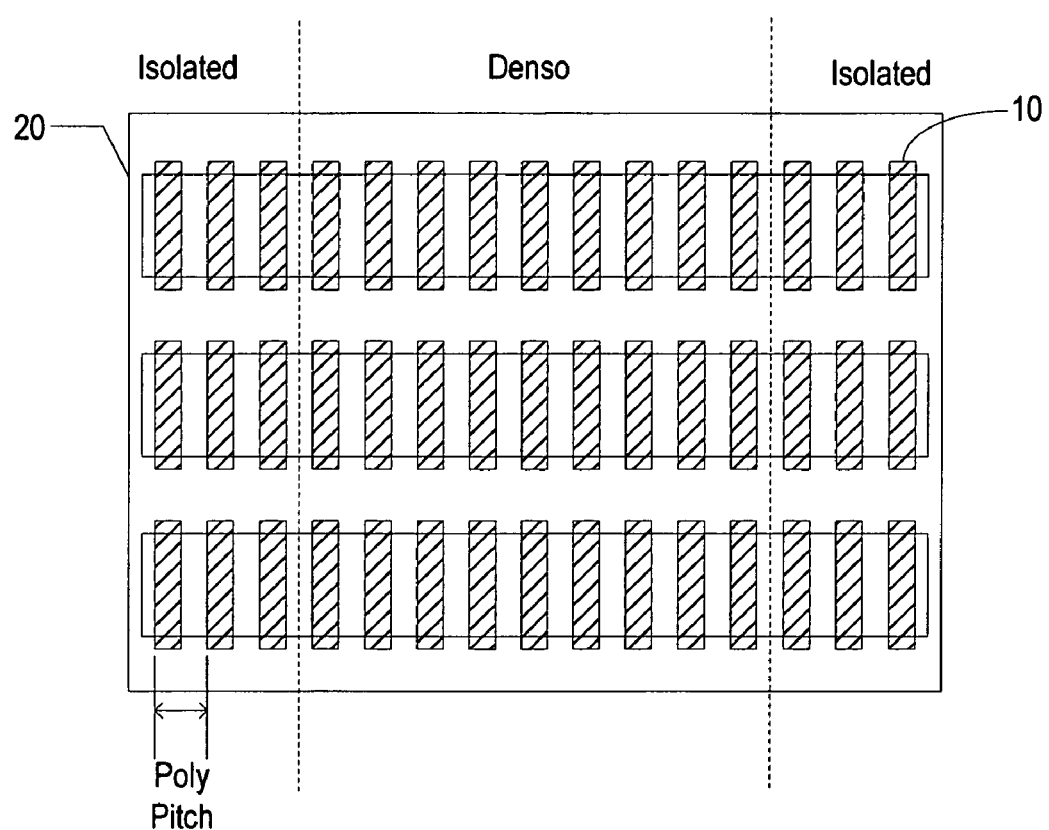
FIG. 2 is a top view of one embodiment of a semiconductor integrated circuit including an exemplary layout of a number of polysilicon gates in an across-chip line-width variation (ACLV) controlled region.

Turning to FIG. 2, a top view of one embodiment of a semiconductor integrated circuit including an exemplary layout of a number of polysilicon (poly) gates in an across-chip line-width variation (ACLV) controlled region is shown. ACLV controlled region 20 includes a plurality of devices each having a polysilicon gate 10. The poly gates 10 are all spaced substantially uniformly throughout ACLV region 20.

When devices are relatively far apart (i.e., the poly pitch is large) the devices may be referred to as "isolated." In contrast, when devices are relatively tightly compacted (i.e., the poly pitch is small) the devices may be referred to as "dense." If the poly pitch is somewhere in between isolated and dense the devices may be referred to as "denso." In the illustrated embodiment, the ACLV region 20 has three sub-regions as denoted by the vertical dashed lines. The middle sub-region is designated as denso. Since there are no poly structures adjacent to ACLV region 20, the outer sub-regions may appear to subsequent process steps as isolated devices. Thus these sub-regions are designated as isolated even though the poly pitch on all the devices in the ACLV region 20 may be substantially the same. In one embodiment, to predict and control the line widths within ACLV region 20, it may be desirable to have all sub-regions appear as denso devices. It is noted that the dashed lines are placed arbitrarily since the transition from a sub-region that may be classified as having a denso to a sub-region that may be classified as having an isolated density may not be well defined.

Figure 3:
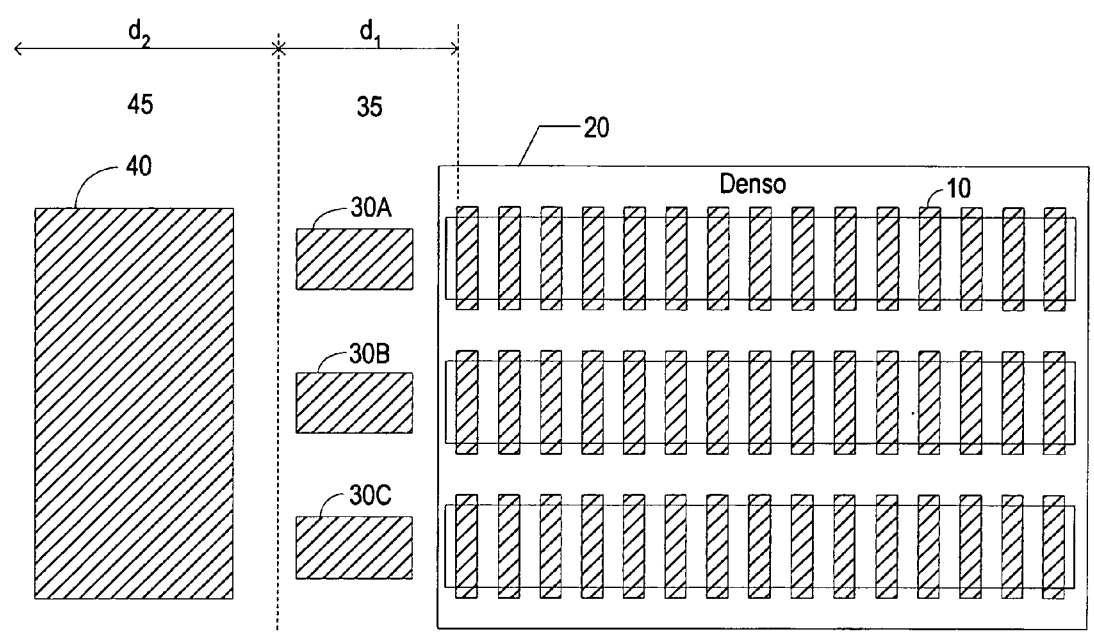
FIG. 3 is a top view of another embodiment of a semiconductor integrated circuit including an ACLV controlled region and dummy polysilicon fill structures.

FIG. 3 illustrates a top view of another embodiment of a semiconductor integrated circuit including an ACLV controlled region 20 and polysilicon fill regions 35 and 45. Similar to the ACLV controlled region 20 of FIG. 2, ACLV controlled region 20 of FIG. 3 also includes a plurality of poly gates 10 that are substantially uniformly arranged. In addition, the semiconductor integrated circuit includes dummy polysilicon fill structures 30A through 30C and dummy polysilicon fill structure 40.

In the illustrated embodiment, fill region 35 is adjacent to and extends away from the ACLV controlled region 20 for a given distance d1. Similarly, fill region 45 is adjacent to and extends away from the fill region 35 for a given distance d2. Manufacturing rules may determine the minimum and maximum poly fill density that may be used in regions 35 and 45. For example, in one embodiment, a given process may allow a poly fill density within a range of 10% to 35% within region 35, while it may be permissible to have up to 70% poly fill within region 45. More particularly, in one embodiment, dummy poly fill structures 30A-30C may be arranged to provide poly fill up to 35% poly density for region 35 and dummy poly fill structure 40 may provide up to 70% density for region 45. Thus, the manufacturing and design rules may allow for as much poly fill as is practicable while adversely affecting the ACLV controlled region 20 as little as possible.

In the illustrated embodiment, since all of the gates may appear uniform to subsequent processing due to the presence of the dummy poly fill structures 30A-30C that are adjacent to the ACLV controlled region 20, the entire ACLV controlled region 20 may be designated denso. This is in contrast to ACLV controlled region 20 of FIG. 2.

Although the use of dummy poly fill structures may cause ACLV controlled region 20 to be more uniformly processed, it may be desirable to use fill regions 35 and 45 to provide decoupling capacitors for the circuits that are in the ACLV controlled region 20 while still maintaining the poly fill densities and controlled ACLV region characteristics discussed above.

Figure 4:
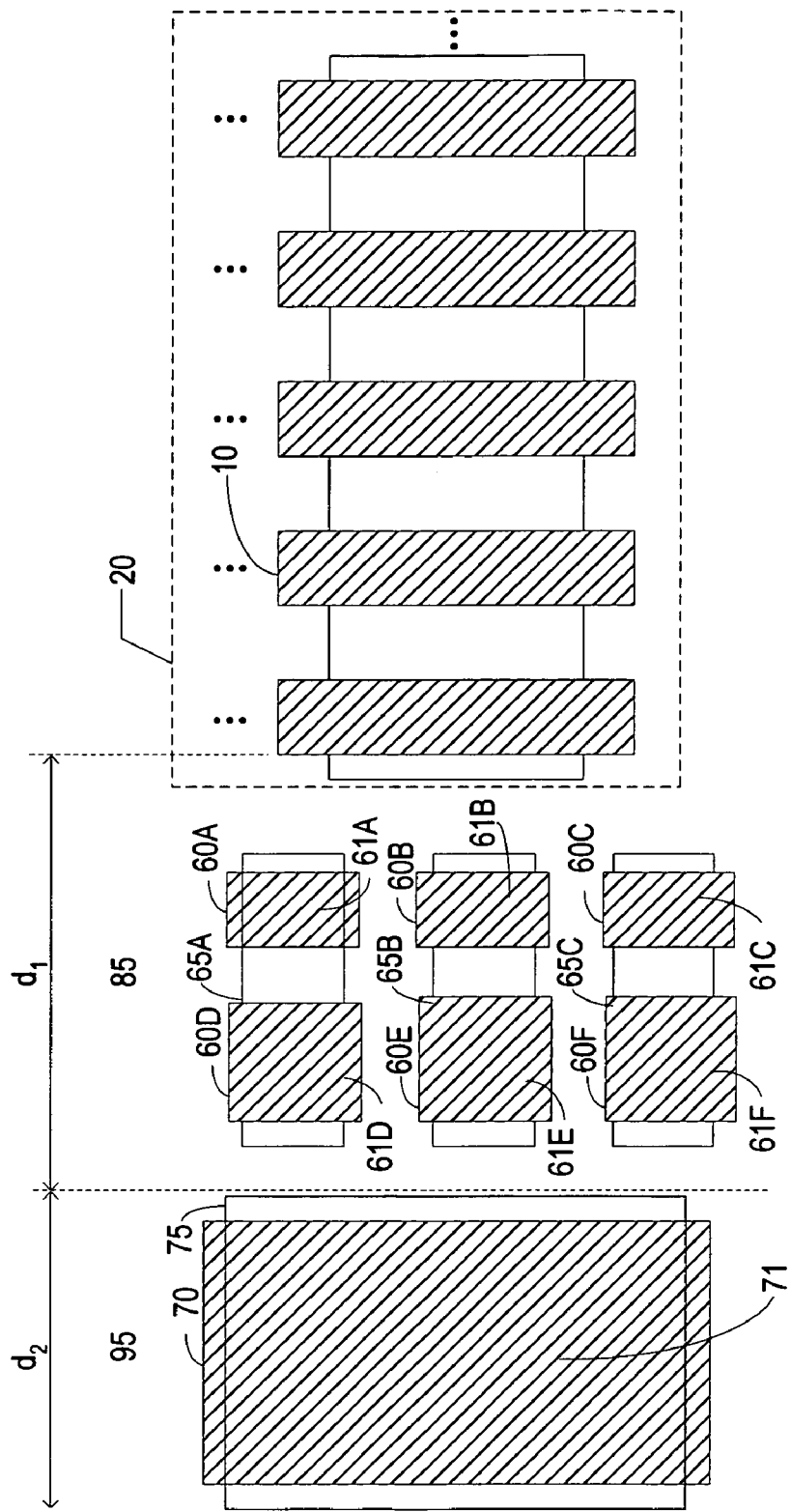
FIG. 4 is a top view of one embodiment of a semiconductor integrated circuit including a portion of an ACLV controlled region and decoupling capacitor regions.

Referring to FIG. 4, a top view of one embodiment of a semiconductor integrated circuit including a portion of an ACLV controlled region 20 and decoupling capacitor regions. In FIG. 4, ACLV controlled region 20 is an exploded view of a portion of the ACLV controlled region 20 illustrated in FIG. 2 and FIG. 3. The semiconductor integrated circuit also includes decoupling capacitor regions 85 and 95. Decoupling capacitor region 85 is adjacent to and extends away from ACLV controlled region 20 for a given distance d1. Similarly, decoupling capacitor region 95 is adjacent to and extends away from the decoupling capacitor region 85 for a given distance d2. Decoupling capacitors 60A through 60F are formed within decoupling capacitor region 85 and decoupling capacitor 70 is formed within decoupling capacitor region 95.

In one embodiment, in contrast to the dummy poly fill structures described above decoupling capacitors 60A-60F include poly electrodes 61A-61F and active regions 65A-65C, respectively. In addition, decoupling capacitor 70 includes a poly electrode 71 and an active region 75. As described above, design and manufacturing rules may control the poly density in the regions adjacent to the ACLV controlled region 20. Thus, decoupling capacitors 60A-60F and 70 may provide two functions: decoupling to circuit ground for the circuits in the ACLV controlled region 20 and sufficient poly fill density to allow the poly density of the ACLV controlled region 20 to appear substantially uniform to subsequent processing. Accordingly, in one embodiment, the poly electrodes 61A-61D may provide up to a 35% poly density within decoupling capacitor region 85 and poly electrode 71 may provide up to a 70% poly density within decoupling capacitor region 95.

It is noted that in other embodiments, it is contemplated that other poly densities may be used. It is also noted that although the decoupling capacitor regions 85 and 95 are shown only to the left of ACLV controlled region 20, it is contemplated that the decoupling capacitor regions 85 and 95 may be formed in any direction (e.g., top, bottom and right) adjacent to ACLV controlled region 20 as desired.

It is further noted that the decoupling capacitors 60A-60F and 70 shown in FIG. 4 have rectangular geometries. However, it is contemplated that in other embodiments, other geometries and other numbers of capacitor structures may be used. For example, instead of one large structure, decoupling capacitor 70 may be formed using a number of smaller structures (e.g., decoupling capacitors 60A-60F) which provide up to the maximum poly density for decoupling capacitor region 95. Likewise, decoupling capacitors 60A-60F may include more or less capacitor structures while still providing up to the maximum poly density for decoupling capacitor region 85.

It is noted that the poly fill density provided by decoupling capacitors 60A-60F and 70 may be increased as the distance from ACLV controlled region 20 is increased. For example, in the illustrated embodiment, poly electrodes 61A-61C are smaller than poly electrodes 61D-61F, thus the increase in poly density may be gradual. However, it is contemplated that in other embodiments, all poly electrodes may be the same size, thereby providing up to the maximum poly density across region 85. In one embodiment, the capacitor poly densities may be implemented using a library of decoupling capacitor cells, which are sometimes referred to as DCAP cells. Each of the DCAP cells in the library may have a different poly density. The DCAP cells having the least poly density may be placed nearest the ACLV controlled region 20. The DCAP cells with the next higher poly density may be placed adjacent to the DCAP cells having the least poly density in a direction away from the ACLV controlled region 20, and the DCAP cells having the most poly density may be placed furthest from the ACLV controlled region 20.

Figure 5:
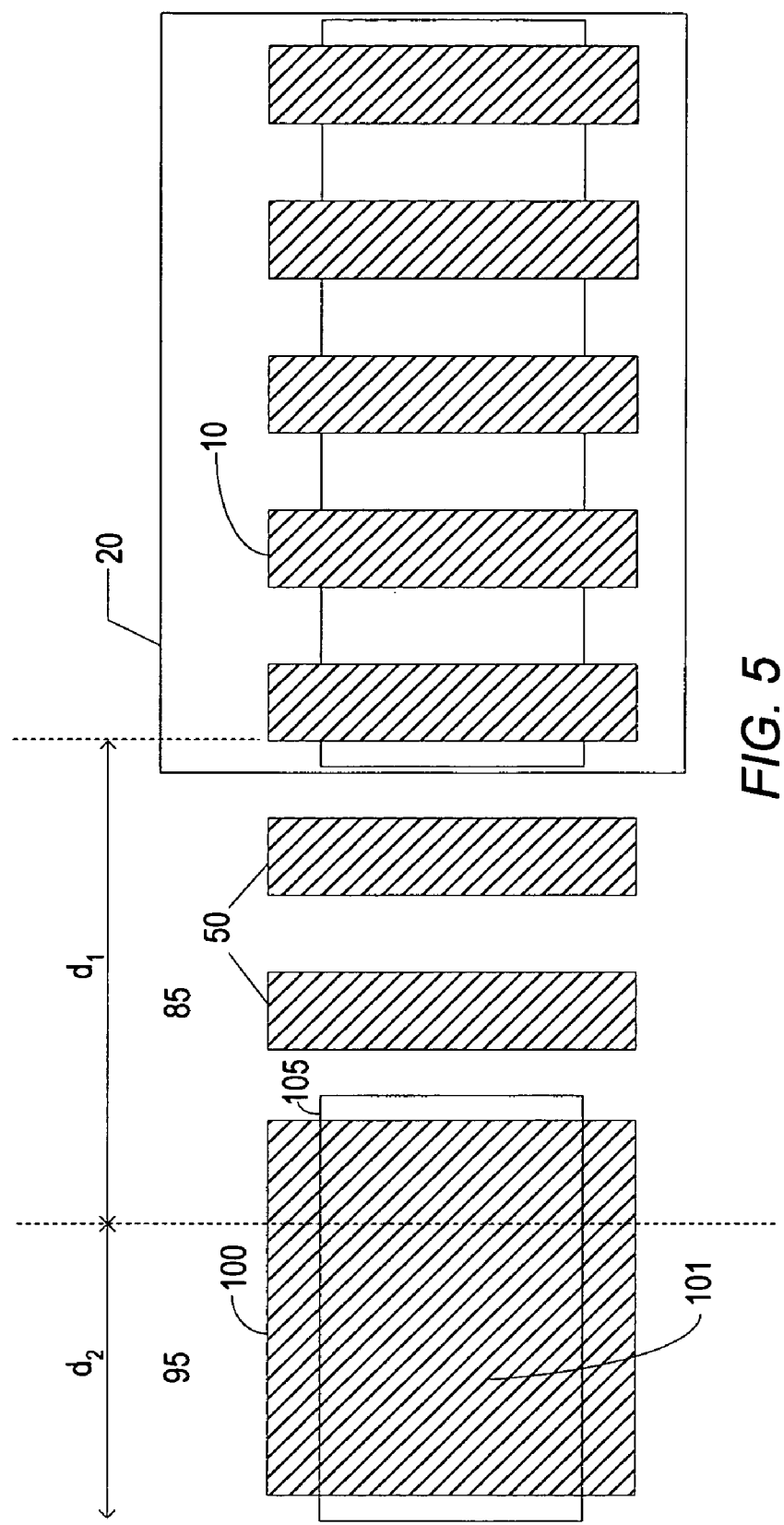
FIG. 5 is a top view of another embodiment of a semiconductor integrated circuit including a portion of an ACLV controlled region and decoupling capacitor regions.

FIG. 5 a top view of another embodiment of a semiconductor integrated circuit including a portion of an ACLV controlled region 20 and decoupling capacitor region. Similar to FIG. 4, ACLV controlled region 20 of FIG. 5 is an exploded view of a portion of the ACLV controlled region 20 illustrated in FIG. 2 and FIG. 3. The semiconductor integrated circuit also includes decoupling capacitor regions 85 and 95. Decoupling capacitor region 85 is adjacent to and extends away from ACLV controlled region 20 for a given distance d1. Similarly, decoupling capacitor region 95 is adjacent to and extends away from the decoupling capacitor region 85 for a given distance d2. However, in contrast to FIG. 4, decoupling capacitor region 85 of FIG. 5 includes two dummy poly gate structures 50 and a portion of decoupling capacitor 100. Thus, decoupling capacitor 100 is formed within decoupling capacitor region 85 and decoupling capacitor region 95.

In the illustrated embodiment, dummy gate structures 50 provide at least a portion of the poly fill density for decoupling capacitor region 85. The remainder of the poly fill density for decoupling capacitor region 85 is provided by poly electrode 101 of decoupling capacitor 100. As described above, the poly fill density provided by dummy poly gates 50 and decoupling capacitor 100 may be increased as the distance away from ACLV controlled region 20 is increased.

Figure 6:
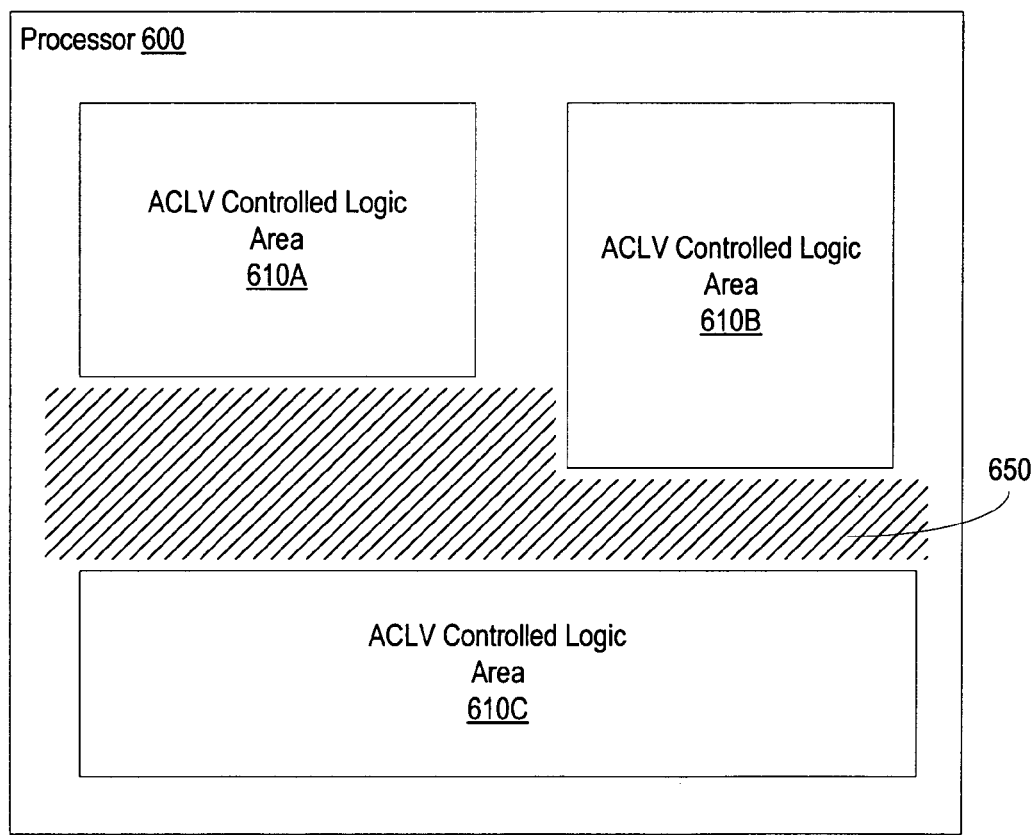
FIG. 6 is a top view of one embodiment of a processor including a plurality of ACLV controlled regions and a decoupling capacitor region.

Turning to FIG. 6, a top view of one embodiment of a processor including a plurality of ACLV controlled regions and decoupling capacitor regions is shown. Processor 600 includes ACLV controlled regions 610A, 610B and 610C and decoupling capacitor region 650. It is noted that ACLV controlled regions 610A, 610B and 610C may be representative of ACLV controlled region 20 of FIG. 1 through FIG. 5 described above. In addition, decoupling capacitor region 650 may be representative of any decoupling capacitor region such as decoupling capacitor regions 85 or 95, for example. Thus, processor 600 is an exemplary semiconductor integrated circuit such as the semiconductor integrated circuits illustrated in FIG. 1 through FIG. 5.

In one embodiment, ACLV controlled regions 610A, 610B and 610C may each include any type of circuits that may be implemented on a processor. For example, ACLV controlled regions 610A, 610B and 610C may include standard cell logic blocks, memory, as well as custom logic circuits. The space that is between the ACLV controlled regions 610A, 610B and 610C may be used to route wiring or in some cases the space may be left void of any logic or wiring. This is sometimes referred to as white space.

However, in the illustrated embodiment, at least a portion of the white space is used as decoupling capacitor region 650. As described above, the decoupling capacitor region 650 may include a number of capacitor structures that have poly electrodes. The poly electrodes and thus the decoupling capacitors may provide sufficient poly density to meet manufacturing and design rules as well as provide decoupling capacitors for the circuits within any of ACLV controlled regions 610A, 610B and 610C.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A semiconductor integrated circuit comprising:
   an across-chip line-width variation (ACLV) controlled region including a plurality of semiconductor devices each having a gate structure and arranged to have a substantially uniform spacing between each gate structure; and
   a decoupling capacitor region including a plurality of capacitor structures each having a conductive structure, wherein the decoupling capacitor region is adjacent to the ACLV controlled region;
   wherein the plurality of capacitor structures is arranged such that a density of a material used to form the conductive structures increases as the distance from the ACLV controlled region increases.

2. The semiconductor integrated circuit as recited in claim 1, wherein the plurality of capacitor structures is formed such that the density of the material used to form the conductive structures is within a predetermined density range within a first distance away from the ACLV controlled region.

3. The semiconductor integrated circuit as recited in claim 1, wherein the decoupling capacitor region is formed such that the density of the material used to form the conductive structures is sufficient to allow each gate structure in the ACLV controlled region to be processed to have substantially uniform gate widths.

4. The semiconductor integrated circuit as recited in claim 1, wherein each gate structure is formed from polycrystalline (poly) silicon.

5. The semiconductor integrated circuit as recited in claim 1, wherein each conductive structure is formed from polycrystalline (poly) silicon.

6. The semiconductor integrated circuit as recited in claim 1, wherein the decoupling capacitor region is arranged by placing each of the plurality of capacitor structures such that capacitor structures having conductive structures with a low poly density are nearest the ACLV controlled region and capacitor structures having conductive structures with a higher poly density are furthest from the ACLV controlled region.

7. A processor comprising:
one or more across-chip line-width variation (ACLV) controlled regions, each including a plurality of semiconductor devices each having a gate structure and arranged to have a substantially uniform spacing between each gate structure; and
one or more decoupling capacitor regions, each including a plurality of capacitor structures each having a conductive structure, wherein the decoupling capacitor region is adjacent to the one or more ACLV controlled regions;
wherein the plurality of capacitor structures is arranged such that a density of a material used to form the conductive structures increases as the distance from any of the one or more ACLV controlled region increases.

* * * * *